US009726719B2

(12) United States Patent
Kuczera et al.

(10) Patent No.: US 9,726,719 B2
(45) Date of Patent: Aug. 8, 2017

(54) SEMICONDUCTOR AUTOMATIC TEST EQUIPMENT

(71) Applicant: INTERNATIONAL BUSINESS MACHINES CORPORATION, Armonk, NY (US)

(72) Inventors: Gabriele Kuczera, Calw (DE); Eckhard Kunigkeit, Stuttgart (DE); Quintino Lorenzo Trianni, Boeblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 111 days.

(21) Appl. No.: 14/664,164

(22) Filed: Mar. 20, 2015

(65) Prior Publication Data
US 2015/0276849 A1 Oct. 1, 2015

(30) Foreign Application Priority Data

Mar. 25, 2014 (GB) .................................. 1405316.9

(51) Int. Cl.
*G01R 31/20* (2006.01)
*G01R 31/28* (2006.01)
(52) U.S. Cl.
CPC ..... *G01R 31/2891* (2013.01); *G01R 31/2889* (2013.01)
(58) Field of Classification Search
CPC .......................... G01R 31/2891; G01R 31/2889
See application file for complete search history.

(56) References Cited

U.S. PATENT DOCUMENTS 7,348,788 B2   3/2008   Yakabe et al.
8,810,270 B2   8/2014   Yang
(Continued)

FOREIGN PATENT DOCUMENTS

| JP | 2010008206 A | 1/2010 |
| JP | 2014238371 A | 12/2014 |
| JP | 2015097292 A | 5/2015 |

OTHER PUBLICATIONS

International Search Report for GB1405316.9 dated Sep. 29, 2014, pp. 1-3.
(Continued)

*Primary Examiner* — Daniel Miller
(74) *Attorney, Agent, or Firm* — Steven Chiu, Esq.; Blanche E. Schiller, Esq.; Heslin Rothenberg Farley & Mesiti P.C.

(57) ABSTRACT

A backing apparatus for use in a semiconductor automatic test equipment including: a probe card holder configured to rigidly affix one or more first portions of a flexible probe card to the probe card holder, wherein a respective back side of each of the one or more first portions is adjacent to the probe card holder when the one or more portions are rigidly affixed to the probe card holder; linear actuators; and a rigid backing plate configured to rigidly affix a second portion of the flexible probe card to the rigid backing plate, wherein one side of the rigid backing plate is adjacent to a back side of the second portion when the second portion is rigidly affixed to the rigid backing plate, wherein each linear actuator is configured to provide backing of another side of the rigid backing plate against the probe card holder.

20 Claims, 3 Drawing Sheets

(56) References Cited

U.S. PATENT DOCUMENTS

| | | |
|---|---|---|
| 2003/0080763 A1 | 5/2003 | Yu et al. |
| 2007/0126440 A1 | 6/2007 | Hobbs et al. |
| 2010/0045322 A1 | 2/2010 | Di Stefano et al. |
| 2011/0234251 A1* | 9/2011 | Komatsu ............ G01R 31/2891 324/756.03 |
| 2013/0027051 A1 | 1/2013 | Ouyang et al. |
| 2013/0106455 A1 | 5/2013 | Edwards et al. |

OTHER PUBLICATIONS

Hwa, Lim Kok et al., "Wafer Level Testing Challenges for Flip Chip and Wafer Level Packages," International Wafer Level Packaging Conference Proceedings, Nov. 2012, pp. 1-6.

Dengler, Eberhard et al., "Auto-Alignment of Backer Plate for Direct Docking Test Boards," U.S. Appl. No. 14/945,011, filed Nov. 18, 2015, pp. 1-32.

List of IBM Patents or Patent Applications Treated as Related, Feb. 21, 2017, pp. 1-2.

\* cited by examiner

SEMICONDUCTOR AUTOMATIC TEST EQUIPMENT

PRIOR FOREIGN APPLICATION

This application claims priority from United Kingdom patent application number 1405316.9, filed Mar. 25, 2014, which is hereby incorporated herein by reference in its entirety.

BACKGROUND

Within the semiconductor industry, one step in the manufacturing process is a wafer test, also known as a wafer prober, a wafer sort, or a semiconductor automatic test using semiconductor automatic test equipment (ATE). During a wafer sort, each die of a wafer under test is electrically tested before wafer dicing of the wafer and subsequent packaging of dies, which have passed the electrical testing. As usual, wafer prober tools comprise a holder for holding a probe card. The probe card provides electrical contacts to a wafer under test loaded into the wafer prober. The wafer prober tools further comprise a wafer stage configured to bring any die on a wafer in proximity of the probe card in a way that electrical contacts of the probe card provide electrical contacts of the die with the electrical testing equipment.

SUMMARY

One or more aspects provide for embodiments that provide effective and reliable electrical contacts between a wafer under test loaded into an ATE and contacts of a probe card affixed to a probe card holder of the ATE. It should be appreciated that aspects of the present invention can be implemented in numerous ways, including as a method, a backing apparatus for use in an ATE, a system, and an ATE. Several embodiments are described below.

In one embodiment, a semiconductor automatic test equipment (ATE) comprising a backing apparatus is provided. The backing apparatus includes, for instance, comprising a probe card holder configured to rigidly affix one or more first portions of a flexible probe card to the probe card holder, wherein a respective back side of each of the one or more first portions is adjacent to the probe card holder when the one or more first portions are rigidly affixed to the probe card holder; linear actuators; and a rigid backing plate configured to rigidly affix a second portion of the flexible probe card to the rigid backing plate, wherein one side of the rigid backing plate is adjacent to a back side of the second portion when the second portion is rigidly affixed to the rigid backing plate, wherein each linear actuator is configured to provide backing of another side of the rigid backing plate against the probe card holder when electrical contacts between a wafer loaded in the ATE for testing and the flexible probe card having the second portion rigidly affixed to the rigid backing plate and the one or more first portions rigidly affixed to the probe card holder are interrupted, wherein the linear actuators are positioned relative to the rigid backing plate in a way enabling continuing of the providing of the backing by the linear actuators when the flexible probe card having the second portion rigidly affixed to the rigid backing plate and the one or more first portions rigidly affixed to the probe card holder provides the electrical contacts to said wafer under test, wherein the one side and the other side of the rigid backing plate are opposite to each other.

BRIEF DESCRIPTION OF THE DRAWINGS

In the following, embodiments of the invention will be described in greater detail by way of example making reference to the drawings in which.

DETAILED DESCRIPTION

Wafer testing is a step performed in wafer fabrication and in test laboratories using semiconductor automatic test equipment (ATE). All chips on a wafer under test are tested for functional defects and performance data by applying special test patterns to them. Performance of a probe card with contact elements for providing electrical contacts between the wafer under test loaded in the ATE and electrical testing equipment is used for successful execution of electrical tests. Establishing the electrical contacts includes parallel alignment of a probe card plane unambiguously determined by contact elements and a surface plane of the wafer under test held by a vacuum on a wafer stage of the ATE. The parallel alignment may be distorted because providing of the electrical contacts may cause non-uniform mechanical loading of the probe card and contact elements contacting the wafer under test in a case when the probe card is not properly/uniformly backed. As a result thereof, some electrical contacts may be distorted. Therefore, one or more aspects provide an apparatus that provides uniform backing of the probe card during electrical testing of wafers in the ATE.

FIGS. 1a-f illustrate sketches of various configurations of an ATE. The sketches are made not to scale for illustrative purposes.

Figure 1A:
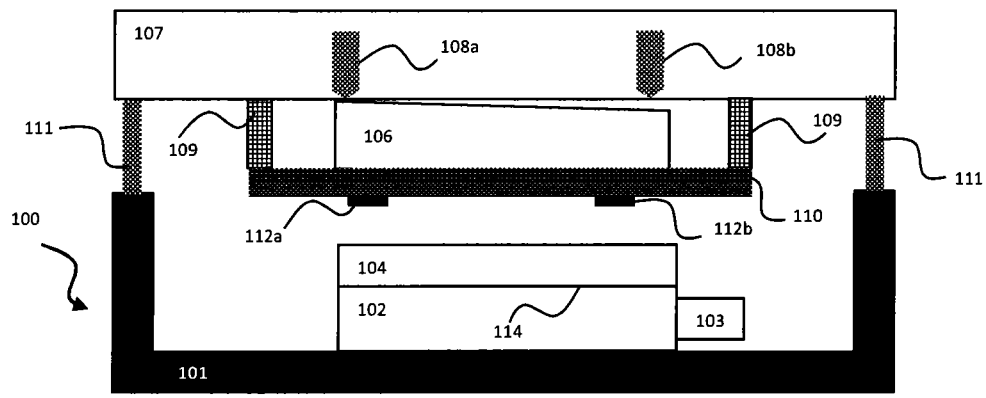
FIGS. 1a-f illustrate sketches of various configurations of an ATE.

FIG. 1a illustrates a sketch of an ATE 100 comprising a chassis 101, a wafer stage 102, leveling actuators 111, a measurement unit 103, a computer microprocessor, and a backing apparatus. The backing apparatus comprises a probe card holder 109, 107, linear actuators 108a, 108b, and a rigid backing plate 106.

The probe card holder is configured for rigidly affixing one or more first portions of a flexible probe card 110 having a front side and a back side, wherein a respective back side of each of the one or more first portions is adjacent to the probe card holder when the one or more first portions are rigidly affixed to the probe card holder. This functionality may be implemented in numerous ways. The one or more portions of the flexible probe card are located, e.g., at a periphery of the flexible probe card. For instance, a periphery of the flexible probe card may be affixed by a clamping ring of the probe card holder. Alternatively, the probe card holder may comprise one or more spacers 109 whereon the flexible probe card may be affixed by screws in respective areas (the one or more first portions) of the flexible probe card. The probe card holder be may made of any rigid material like aluminum or steel.

The flexible probe card may be made of a flexible printed circuit board material. The flexible probe card is configured to provide electrical contacts between electrical testing equipment and a wafer under test loaded into the ATE for electrical testing. It may comprise metallization layers connected with contact elements of the front side of the second portion of the flexible probe card for providing electrical contacts to respective metallization pads on the wafer under test. The contact elements may be needles. The flexible probe card further comprises reference elements 112a, 112b on a front side of the second portion of the flexible probe card. These reference elements may be, but are not limited to, structured metallization layers or tips of needles for providing electrical contacts between the wafer under test and the flexible probe card.

The rigid backing plate 106 is configured for rigidly affixing the second portion of the flexible probe card 110 to the rigid backing plate, wherein one side of the rigid backing plate is adjacent to a back side of the second portion when the second portion is rigidly affixed to the rigid backing plate. The rigid backing plate may be made of any rigid material like aluminum or steel.

Each linear actuator 108a, 108b is configured for providing backing of another side of the rigid backing plate against the probe card holder when electrical contacts between the wafer 104 loaded in the ATE for the electrical testing and the flexible probe card having the second portion rigidly affixed to the rigid backing plate and the one or more first portions rigidly affixed to the probe card holder are interrupted. The linear actuators are positioned relative to the rigid backing plate in a way enabling continuing of the providing of the backing by all linear actuators when the flexible probe card having the second portion rigidly affixed to the rigid backing plate and the one or more first portions rigidly affixed to the probe card holder provides the electrical contacts to the wafer under test. The one side and the another side of the rigid backing plate are opposite to each other.

The wafer stage 102 mounted on a chassis 101 of the ATE is configured for holding the wafer under test loaded in the ATE for the electrical testing, wherein the wafer stage comprises a mount surface for holding the wafer thereon and the mount surface is parallel to a system reference plane. The wafer stage is further configured to position the wafer being held on the wafer stage relative to the flexible probe card having the second portion rigidly affixed to the rigid backing plate and the one or more first portions of the flexible probe card rigidly affixed to the probe card holder in a way that the electrical contacts to the wafer under test are provided by the flexible probe card, when all linear actuators provide the backing of the backing plate against the probe card holder.

The measurement unit 103 is configured for registering at least one of the following changes in one or more leveling distances or registering leveling data characterizing leveling distances, wherein each reference element has the respective leveling distance to a system reference plane of the ATE when the one or more first portions are rigidly affixed to the probe card holder. The reference elements define unambiguously a probe card reference plane. The measurement unit may be a part of the backing apparatus.

The leveling actuators 111 are configured for leveling the probe card holder in a way that leveling distances between the system reference plane and the reference elements on the front side of the second portion of the flexible probe card having the one or more first portions rigidly affixed to the probe card holder are equal. The leveling actuators are further configured to provide support of the probe card holder against the chassis 101. The reference elements define unambiguously a probe card reference plane, wherein the probe card reference plane is parallel to the system reference plane after performing the actuating of the leveling actuators in way that the leveling distances are equal. The ATE comprises at least three leveling actuators.

The backing apparatus may further comprise a controller configured for actuating each linear actuator in a way that each linear actuator provides the backing, wherein the actuating of each linear actuator is stopped when onset of a change in at least one leveling distance is registered by the measurement unit. The controller may be a proportional-integral-derivative (PID) controller, wherein each linear actuator is actuated using the at least one leveling distance as a feedback signal. The backing apparatus comprises at least three linear actuators.

One or more of the linear actuators 108a, 108b may be rigidly affixed to the probe card holder and each linear actuator rigidly affixed to the probe card holder is configured for providing backing of the other side of the rigid backing plate against the probe card holder in a respective backing point of each linear actuator, wherein all backing points are located on a periphery of the other side of the rigid backing plate (FIG. 1a).

Figure 1B:
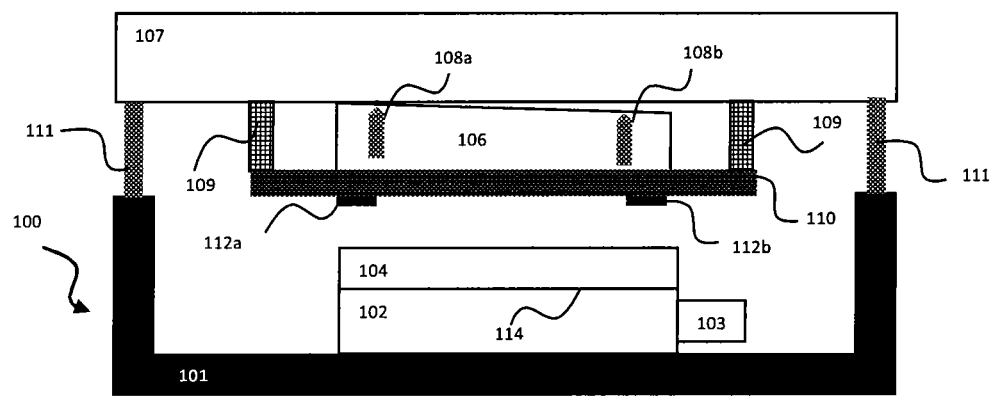

One or more of the linear actuators may be rigidly affixed on a periphery of the rigid backing plate and each linear actuator is configured for providing backing of the other side of the rigid backing plate against the probe card holder in a respective backing point of each linear actuator, wherein all backing points are located on a side of the probe card holder facing the rigid backing plate (FIG. 1b).

Alternatively, the linear actuators may be split in a first and a second group. The linear actuators of the first group are rigidly affixed to the probe card holder and each linear actuator rigidly affixed to the probe card holder is configured for providing backing of the other side of the rigid backing plate against the probe card holder in a respective backing point of each linear actuator. The linear actuators of the second group are rigidly affixed on a periphery of the rigid backing plate and each linear actuator is configured for providing backing of the other side of the rigid backing plate against the probe card holder in a respective backing point of each linear actuator, wherein all backing points are located on a side of the probe card holder facing the rigid backing plate.

The functioning and proper positioning of the linear actuators is further illustrated on FIGS. 1c-f. The sketches are made in 2D for illustrative purposes.

Figure 1C:
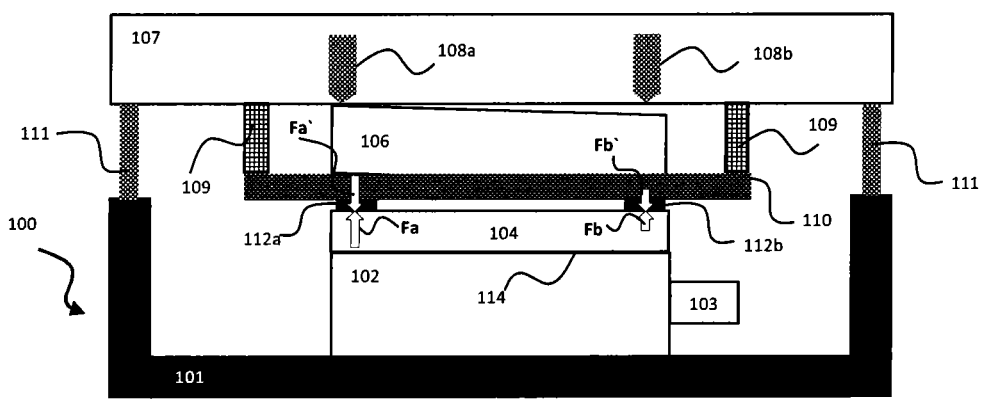

FIG. 1c illustrates a case when the linear actuators do not provide backing of the rigid backing plate against the probe card holder. Since there is a gap between the rigid backing plate and the probe card holder (as depicted in FIG. 1c), the backing of the rigid backing plate is provided only in one single backing point in the top left corner of the backing plate (in the vicinity of the linear actuator 108a), where the rigid backing plate is in mechanical contact with the probe card holder. As a result thereof, when the wafer under test is positioned by the wafer stage in a position where the electrical contacts between the wafer under test and the flexible probe card have to be provided, a mechanical loading (forces depicted by vectors Fa' and Fa) of the contact element 112a against the wafer surface is higher than a mechanical loading (forces depicted by vectors Fb' and Fb) of the contact element 112b against the wafer surface, because the latter is located further away from the single backing point than the contact element 112a and the flexible probe card alone is not rigid enough for providing a uniform mechanical loading of the contact elements. The difference in mechanical loading of the contact elements results in a faulty electrical contact provided by the contact element 112b, because it has a lower mechanical loading in comparison with the contact element 112a.

Figure 1D:
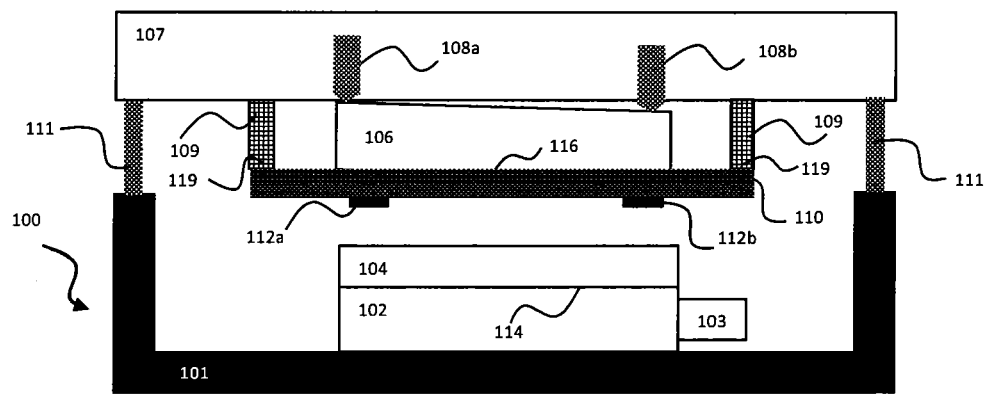
Figure 1E:
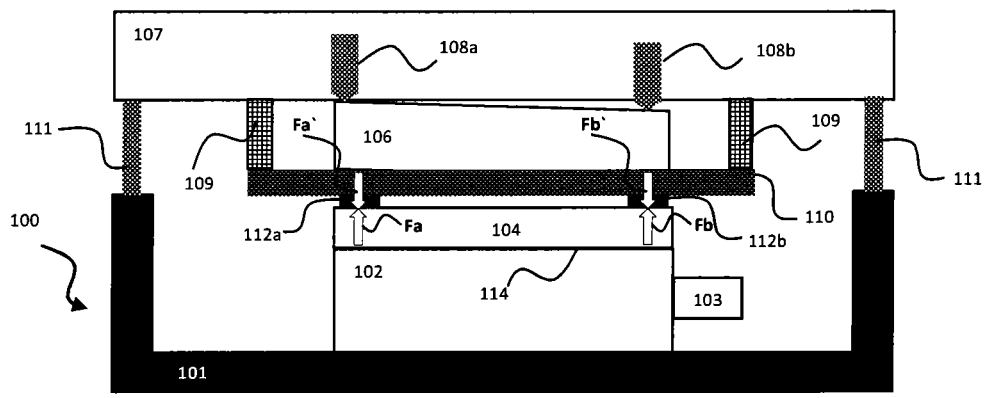

FIGS. 1d-e illustrate the aforementioned case when the linear actuators do provide backing of the rigid backing plate against the probe card holder. As depicted on FIG. 1d linear actuators 108a and 108b are actuated as described above in a way that they provide backing in the respective points on the other side of the rigid backing plate. The backing point of the linear actuator 108a (108b) is located in the vicinity of the top left (right) corner of the rigid backing plate. As a result thereof, when the wafer under test is positioned by the wafer stage in a position where the electrical contacts between the wafer under test and the flexible probe card have to be provided, a mechanical loading (forces depicted by vectors Fa' and Fa—FIG. 1e) of the contact element 112a against the wafer surface is substantially similar as a mechanical loading (forces depicted by vectors Fb' and Fb) of the contact element 112b against the wafer surface, because the rigid backing plate is uniformly backed by the linear actuators. This uniform mechanical loading of the contact elements 112a and 112b results in providing electrical contacts by both of the contact elements to the wafer.

Figure 1F:
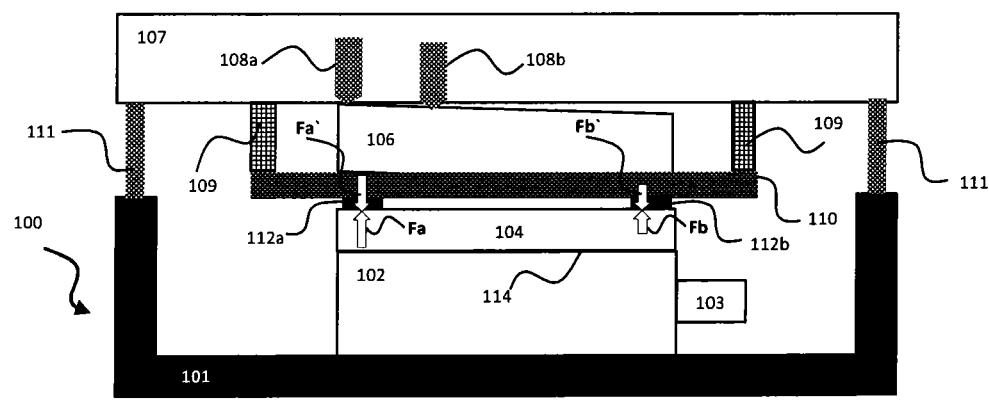

FIG. 1f illustrates another case illustrating the importance of positioning the linear actuators relative to the rigid backing plate in a way enabling continuing of the providing of the backing by all linear actuators when the flexible probe card having the second portion rigidly affixed to the rigid backing plate and the one or more first portions rigidly affixed to the probe card holder provides the electrical contacts to the wafer under test. As it will be clearly seen from the following discussion, the linear actuators 108a and 108b are positioned in a way that the aforementioned condition is not satisfied. The configuration of the rigid backing plate is the same as in the case depicted in FIG. 1c. Both the linear actuators are located in the vicinity of the top left corner of the rigid backing plate. Even if the linear actuators are actuated in a way as described above, the uniform backing of the rigid backing plate is not provided, i.e. the top right corner of the rigid backing plate is not backed. As a result thereof, the mechanical loading of the contact elements 112a and 112b is similar to the case illustrated in FIG. 1c. The difference in mechanical loading of the contact elements results in a faulty electrical contact provided by the contact element 112b, because it has lower mechanical loading in comparison with the contact element 112a.

The measurement unit 103 may be implemented in various ways and be based on various principles. The measurement unit may comprise an optical imaging system configured for: capturing optical images of each reference element; determining one or more focus parameters for capturing optical images of each reference element; and registering changes in each leveling distance between the system reference plane and the respective reference element by monitoring changes in the one or more focus parameters for capturing optical images of the respective reference element. The focus parameters depend on a particular type of the optical imaging system. For instance, if the optical system is a confocal microscope, the focus parameters may comprise a position of a pinhole diaphragm of the confocal microscope. In case when the optical imaging system is equipped with autofocus functionality, then the focus parameters may comprise relative positions of lenses in an optical path of the optical imaging system.

Alternatively, the measurement unit may comprise a mechanical measurement unit configured for one of the following: the registering of the changes in the one or more leveling distances or registering the leveling distances.

As another solution, the measurement unit may further comprise an ultrasonic distance sensor configured for the registering of the changes in the one or more leveling distances. The ultrasonic distance sensor may be further configured for the registering of the one or more leveling distances. In the latter case, since the speed of sound in air depends on humidity, an etalon distance is to be measured by the ultrasonic distance sensor in order to compensate for variation of the speed of sound caused by the change in air humidity.

The computer microprocessor is configured for causing the ATE to: evaluate the leveling distances using the leveling data registered by the measurement unit; actuate the leveling actuators in a way that the leveling distances are equal; and actuate each linear actuator in a way that each linear actuator provides the backing when electrical contacts between a wafer 104 loaded in the ATE for testing and the flexible probe card having the second portion rigidly affixed to the rigid backing plate and the one or more first portions rigidly affixed to the probe card holder are interrupted, wherein the actuating of each linear actuator is stopped upon onset of a change in at least one evaluated leveling distance, wherein the linear actuators are positioned relative to the rigid backing plate in a way enabling continuing of the providing of the backing by all linear actuators when the flexible probe card having the second portion rigidly affixed to the rigid backing plate and the one or more first portions rigidly affixed to the probe card holder provides the electrical contacts to the wafer under test. Utilization of more than one leveling distances for stopping the actuation of any of the linear actuators may increase the accuracy of this operation, for instance by using an onset of a change in an average of several of the leveling distances for the stopping of the actuation. In addition or as an alternative, a PID controlling principle may be used for better controlling/actuating each of the linear actuators, wherein the one or more leveling distances or an average of the one or more leveling distances is/are used as feedback for actuating each of the linear actuators.

Figure 2:
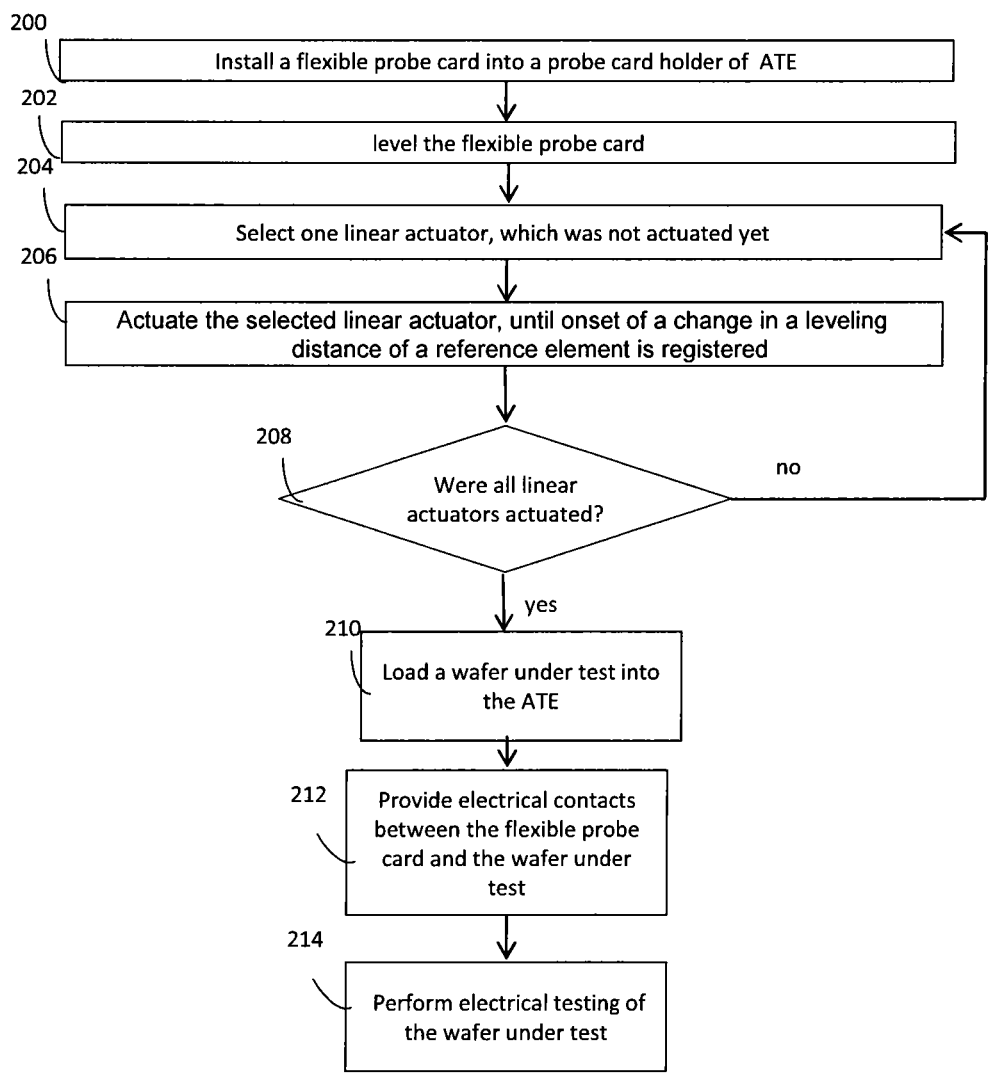
FIG. 2 is one example of a flow chart of process blocks for operating an ATE.

FIG. 2 is a flow diagram of process blocks for operating the ATE, in one embodiment.

In a process block 200, the flexible probe card is affixed to the probe card holder as described above.

After execution of the process block 200, a process block 202 is executed, wherein the probe card holder and the flexible probe card affixed to it are leveled by actuating the leveling actuators in a way that all the leveling distances of the reference elements are equal as described above.

After execution of the process block 202, a process block 204 is executed, wherein one of the linear actuators, which was not actuated yet, is selected.

After execution of the process block 204, a process block 206 is executed, wherein the selected linear actuator is actuated until onset of a change in a leveling distance of at least one reference element is registered by the measurement unit.

After execution of the process block 206, a decision process block 208 is executed, wherein the decision process block 208 causes execution of the process block 210 in a case when all linear actuators were actuated, otherwise the decision process block causes execution of the process block 204.

In the process block 210, a wafer is loaded in the ATE for electrical testing. In this process block, the wafer is placed on a wafer stage.

After execution of the process block 210, a process block 212 is executed, wherein electrical contacts between the flexible probe card and the loaded wafer are provided. The providing of the electrical contacts is performed by causing the wafer stage to move the wafer on the wafer stage to a respective position.

After execution of the process block 212, a process block 214 is executed, wherein electrical testing equipment is caused to perform the electrical testing of the wafer. The flexible probe card provides the electrical contacts between the wafer and the electrical testing equipment.

The process blocks 212 and 214 may be repeated, when the wafer comprises more than one die to be tested. In this case, in the process block 212 the electrical contacts are provided between one of the dies to be tested and the electrical testing equipment. During repetitive execution of the process block 212, the electrical contacts are provided between one not yet tested die and the electrical testing equipment. The providing of the electrical contacts is performed by causing the wafer stage to move the one not yet tested die on the wafer to a respective position. During repetitive execution of the process block 214, the electrical testing equipment is caused to perform the electrical testing of the one not yet tested die of the wafer. The flexible probe card provides the electrical contacts between the one not yet tested die on the wafer and the electrical testing equipment.

Those skilled in the art will clearly understand that the process block 210 may be executed earlier than any of the preceding process blocks.

The execution of any of the process blocks 202, 204, 206, 208, 210, 214 may be caused by a computer microprocessor of the ATE.

The execution of any process blocks 204, 206, 208 may be caused by the controller of the backing apparatus.

As described herein, one or more aspects provide for embodiments that provide effective and reliable electrical contacts between a wafer under test loaded into an ATE and contacts of a probe card affixed to a probe card holder of the ATE. It should be appreciated that aspects of the present invention can be implemented in numerous ways, including as a method, a backing apparatus for use in a ATE, a system, and an ATE, as examples.

One embodiment provides for a backing apparatus for use in an ATE comprising a probe card holder device. The probe card holder device comprises: a probe card holder configured for rigidly affixing one or more first portions of a flexible probe card to the probe card holder, wherein a respective back side of each of the one or more first portions is adjacent to the probe card holder when the one or more portions are rigidly affixed to the probe card holder; linear actuators; and a rigid backing plate configured for rigidly affixing a second portion of the flexible probe card to the rigid backing plate, wherein one side of the rigid backing plate is adjacent to a back side of the second portion when the second portion is rigidly affixed to the rigid backing plate, wherein each linear actuator is configured for providing backing of another side of the rigid backing plate against the probe card holder when electrical contacts between a wafer loaded in the ATE for testing and the flexible probe card having the second portion rigidly affixed to the rigid backing plate and the one or more first portions rigidly affixed to the probe card holder are interrupted, wherein the linear actuators are positioned relative to the rigid backing plate in a way enabling continuing of the providing of the backing by all linear actuators when the flexible probe card having the second portion rigidly affixed to the rigid backing plate and the one or more first portions rigidly affixed to the probe card holder provides the electrical contacts to the wafer under test, wherein the one side and the other side of the rigid backing plate are opposite to each other.

Another embodiment provides for the backing apparatus comprising: a measurement unit configured for registering changes in one or more leveling distances, wherein the flexible probe card has one or more reference elements on a front side of the second portion, wherein each reference element has the respective leveling distance to a system reference plane of the ATE when the one or more first portions are rigidly affixed to the probe card holder; and a controller configured for actuating each linear actuator in a way that each linear actuator provides the backing, wherein the actuating of each linear actuator is stopped when onset of a change in at least one leveling distance is registered by the measurement unit.

Yet another embodiment provides for the backing apparatus, wherein one or more of the linear actuators are rigidly affixed to the probe card holder and each linear actuator rigidly affixed to the probe card holder is configured for providing backing of the another side of the rigid backing plate against the probe card holder in a respective backing point of each linear actuator, wherein all backing points are located on a periphery of the other side of the rigid backing plate.

Yet another embodiment provides for the backing apparatus, wherein one or more of the linear actuators are rigidly affixed on a periphery of the rigid backing plate and each linear actuator is configured for providing backing of the other side of the rigid backing plate against the probe card holder in a respective backing point of each linear actuator, wherein all backing points are located on a side of the probe card holder facing the rigid backing plate.

Yet another embodiment provides for the backing apparatus, wherein the one or more first portions are located at a periphery of the flexible probe card.

Yet another embodiment provides for the backing apparatus, wherein the probe card holder device comprises at least three linear actuators.

Yet another embodiment provides for the backing apparatus, wherein at least a portion of the reference elements are tips of contact elements of the flexible probe card, wherein the contact elements provide the electrical contacts to the wafer under test.

Yet another embodiment provides for the backing apparatus, wherein the measurement unit comprises an optical imaging system configured for: capturing optical images of each reference element; determining one or more focus parameters for capturing optical images of each reference element; and registering changes in each leveling distance between the system reference plane and the respective reference element by monitoring changes in the one or more focus parameters for capturing optical images of the respective reference element.

Yet another embodiment provides for the backing apparatus, wherein the measurement unit comprises a mechanical measurement unit configured for the registering of the changes in the one or more leveling distances.

Yet another embodiment provides for the backing apparatus, wherein the measurement unit comprises an ultrasonic distance sensor configured for the registering of the changes in the one or more leveling distances.

Yet another embodiment provides a method for backing a flexible probe card in an ATE. One or more first portions of a flexible probe card are rigidly affixed to a probe card holder of the ATE. A respective back side of each of the one or more first portions is adjacent to the probe card holder. A rigid backing plate has one side rigidly affixed to a second portion of the flexible probe card and another side facing the probe card holder, wherein a back side of the second portion is adjacent to the one side of the rigid backplane. Each linear actuator is configured for providing backing of the other side of the rigid backing plate against the probe card holder when electrical contacts between a wafer loaded in the ATE for testing and the flexible probe card having the second portion rigidly affixed to the rigid backing plate and the one or more first portions rigidly affixed to the probe card holder are interrupted. The linear actuators are positioned relative to the rigid backing plate in a way enabling continuing of the providing of the backing by all linear actuators when the flexible probe card having the second portion rigidly affixed to the rigid backing plate and the one or more first portions rigidly affixed to the probe card holder provides the electrical contacts to the wafer under test. The one side and the other side of the rigid backing plate are opposite to each other. The method comprises the following: sequentially actuating linear actuators until each actuator provides the backing, wherein onset of a change in a leveling distance between at least one reference element on the front surface of the second portion of the flexible probe card and a system reference plane is used as a criterion for stopping the actuating of each linear actuator.

Yet another embodiment provides for the method comprising: capturing one or more optical images of at the least one reference element; determining one or more focus parameters for the capturing of the one or more optical images; and registering changes in the leveling distance of the at least one reference element by monitoring changes in the one or more focus parameters.

Yet another embodiment provides for an ATE comprising a probe card holder device. The probe card holder device comprises: a probe card holder configured for rigidly affixing one or more first portions of a flexible probe card to the probe card holder, wherein a respective back side of each of the one or more first portions is adjacent to the probe card holder when the one or more portions are rigidly affixed to the probe card holder; linear actuators; and a rigid backing plate configured for rigidly affixing a second portion of the flexible probe card to the rigid backing plate, wherein one side of the rigid backing plate is adjacent to a back side of the second portion when the second portion is rigidly affixed to the rigid backing plate, wherein each linear actuator is configured for providing backing of another side of the rigid backing plate against the probe card holder, wherein the one side and the other side of the rigid backing plate are opposite to each other.

The ATE further comprises a measurement unit configured for registering leveling data characterizing leveling distances between a system reference plane of the ATE and reference elements on a front side of the second portion of the flexible probe card having the one or more first portions rigidly affixed to the probe card holder; leveling actuators configured for leveling the probe card holder in a way that leveling distances between the system reference plane and the reference elements on the front side of the second portion of the flexible probe card having the one or more first portions rigidly affixed to the probe card holder are equal; and a computer microprocessor.

The computer microprocessor is configured for causing the ATE to: evaluate the leveling distances using the leveling data registered by the measurement unit; actuate the leveling actuators in a way that the leveling distances are equal; and actuate each linear actuator in a way that the each linear actuator provides the backing when electrical contacts between a wafer loaded in the ATE for testing and the flexible probe card having the second portion rigidly affixed to the rigid backing plate and the one or more first portions rigidly affixed to the probe card holder are interrupted, wherein the actuating of each linear actuator is stopped upon onset of a change in at least one evaluated leveling distance, wherein the linear actuators are positioned relative to the rigid backing plate in a way enabling continuing of the providing of the backing by all linear actuators when the flexible probe card having the second portion rigidly affixed to the rigid backing plate and the one or more first portions rigidly affixed to the probe card holder provides the electrical contacts to the wafer under test.

Yet another embodiment provides for the ATE comprising a wafer stage configured for holding a wafer. The wafer stage comprises a mount surface for holding the wafer thereon and the mount surface is parallel to the system reference plane. The reference elements define unambiguously a probe card reference plane. The probe card reference plane is parallel to the system reference plane after performing the actuating of the leveling actuators in way that the leveling distances are equal.

Yet another embodiment provides for a method for providing electrical contacts between a flexible probe card and a wafer under test in an ATE. One or more first portions of a flexible probe card are rigidly affixed to a probe card holder of the ATE. The respective back sides of the one or more first portions are adjacent to the probe card holder. A rigid backing plate has one side rigidly affixed to a second portion of the flexible probe card and another side facing the probe card holder, wherein a back side of the second portion is adjacent to the one side of the rigid backplane. Each linear actuator is configured for providing backing of another side of the rigid backing plate against the probe card holder. The one side and the other side of the rigid backing plate are opposite to each other. The method comprises the following: leveling the flexible probe card in a way that leveling distances between reference elements on a front side of the second portion of the flexible probe card and a system reference plane of the ATE are equal; sequentially actuating linear actuators until each actuator provides the backing, wherein onset of a change in a leveling distance between at least one reference element on the front surface of the second portion of the flexible probe card and a system reference plane is used as a criterion for stopping the actuating of each linear actuator; and after the actuating of the each linear actuator providing electrical contacts between the flexible probe card and the wafer under test in the ATE, wherein the linear actuators are positioned relative to the rigid backing plate in a way enabling continuing of the providing of the backing.

What is claimed is:

1. A semiconductor automatic test equipment (ATE) comprising a backing apparatus, the backing apparatus comprising:

a probe card holder configured to rigidly affix one or more first portions of a flexible probe card to the probe card holder, wherein a respective back side of each of the one or more first portions is adjacent to the probe card holder when the one or more first portions are rigidly affixed to the probe card holder;

linear actuators; and a rigid backing plate configured to rigidly affix a second portion of the flexible probe card to the rigid backing plate, wherein one side of the rigid backing plate is adjacent to a back side of the second portion when the second portion is rigidly affixed to the rigid backing plate, wherein each linear actuator is configured to provide backing of another side of the rigid backing plate against the probe card holder when electrical contacts between a wafer loaded in the ATE for testing and the flexible probe card having the second portion rigidly affixed to the rigid backing plate and the one or more first portions rigidly affixed to the probe card holder are interrupted, wherein the linear actuators are positioned relative to the rigid backing plate in a way enabling continuing of the providing of the backing by the linear actuators when the flexible probe card having the second portion rigidly affixed to the rigid backing plate and the one or more first portions rigidly affixed to the probe card holder provides the electrical contacts to said wafer under test, wherein the one side and the other side of the rigid backing plate are opposite to each other.

2. The semiconductor automatic test equipment of claim 1, further comprising:
a measurement unit configured to register changes in one or more leveling distances, wherein the flexible probe card has one or more reference elements on a front side of the second portion, wherein each reference element has a respective leveling distance to a system reference plane of the ATE when the one or more first portions are rigidly affixed to the probe card holder; and
wherein the backing apparatus further comprises a controller configured to actuate each linear actuator in a way that each linear actuator provides the backing, wherein the actuating of each linear actuator is stopped when onset of a change in at least one leveling distance is registered by the measurement unit.

3. The semiconductor automatic test equipment of claim 2, wherein at least a portion of the reference elements are tips of contact elements of the flexible probe card, wherein the contact elements provide the electrical contacts to said wafer under test.

4. The semiconductor automatic test equipment of claim 2, wherein the measurement unit comprises an optical imaging system configured to:
capture optical images of each reference element;
determine one or more focus parameters for capturing optical images of each reference element; and
register changes in each leveling distance between the system reference plane and the respective reference element by monitoring changes in the one or more focus parameters for capturing optical images of said respective reference element.

5. The semiconductor automatic test equipment of claim 2, wherein the measurement unit comprises a mechanical measurement unit configured to register the changes in the one or more leveling distances.

6. The semiconductor automatic test equipment of claim 2, wherein the measurement unit comprises an ultrasonic distance sensor configured to register the changes in the one or more leveling distances.

7. The semiconductor automatic test equipment of claim 1, wherein one or more of the linear actuators are rigidly affixed to the probe card holder and each linear actuator rigidly affixed to the probe card holder is configured to provide backing of the other side of the rigid backing plate against the probe card holder in a respective backing point of each linear actuator, wherein the backing points are located on a periphery of the other side of the rigid backing plate.

8. The semiconductor automatic test equipment of claim 1, wherein one or more of the linear actuators are rigidly affixed on a periphery of the rigid backing plate and each linear actuator is configured to provide backing of the other side of the rigid backing plate against the probe card holder in a respective backing point of each linear actuator, wherein the backing points are located on a side of the probe card holder facing the rigid backing plate.

9. The semiconductor automatic test equipment of claim 1, wherein the one or more first portions are located at a periphery of the flexible probe card.

10. The semiconductor automatic test equipment of claim 1, wherein the backing apparatus comprises at least three linear actuators.

11. The semiconductor automatic test equipment of claim 1, further comprising:
a measurement unit configured to register leveling data characterizing leveling distances between a system reference plane of the ATE and reference elements on a front side of the second portion of the flexible probe card having the one or more first portions rigidly affixed to the probe card holder; and
leveling actuators configured to level the probe card holder in a way that leveling distances between the system reference plane and the reference elements on the front side of the second portion of the flexible probe card having the one or more first portions rigidly affixed to the probe card holder are equal.

12. The semiconductor automatic test equipment of claim 11, further comprising:
a computer microprocessor configured to cause the ATE to:
evaluate the leveling distances using the leveling data registered by the measurement unit; and
actuate the leveling actuators in way that the leveling distances are equal.

13. The semiconductor automatic test equipment of claim 12, further comprising a wafer stage configured to hold a wafer, wherein the wafer stage comprises a mount surface for holding the wafer thereon and the mount surface is parallel to the system reference plane, wherein the reference elements define unambiguously a probe card reference plane, wherein the probe card reference plane is parallel to the system reference plane after performing the actuating of the leveling actuators in way that the leveling distances are equal.

14. A method of backing flexible probe cards in a semiconductor automatic test equipment (ATE), the method comprising:
having a flexible probe card, wherein one or more first portions of the flexible probe card are rigidly affixed to a probe card holder of the ATE, wherein a respective back side of each of the one or more first portions is adjacent to the probe card holder, wherein a rigid backing plate of the ATE has one side rigidly affixed to a second portion of the flexible probe card and another side facing the probe card holder, wherein a back side of the second portion is adjacent to the one side of the rigid back plate;
having linear actuators, wherein each linear actuator is configured to provide backing of the other side of the rigid backing plate against the probe card holder when electrical contacts between a wafer loaded in the ATE for testing and the flexible probe card having the second portion rigidly affixed to the rigid backing plate and the one or more first portions rigidly affixed to the probe card holder are interrupted, wherein the linear actuators are positioned relative to the rigid backing plate in a way enabling continuing of the providing of the backing by linear actuators when the flexible probe card having the second portion rigidly affixed to the rigid backing plate and the one or more first portions rigidly affixed to the probe card holder provides the electrical contacts to said wafer under test, wherein the one side and the another side of the rigid backing plate are opposite to each other; and sequentially actuating linear actuators until each linear actuator provides the backing, wherein onset of a change in a leveling distance between at least one reference element on the front surface of the second portion of the flexible probe card and a system reference plane is used as a criterion for stopping of the actuating of each linear actuator.

15. The method of claim 14, further comprising:

capturing one or more optical images of at the least one reference element;

determining one or more focus parameters for the capturing of the one or more optical images; and registering changes in the leveling distance of the at least one reference element by monitoring changes in the one or more focus parameters.

16. The method of claim 15, wherein one or more of the at least one reference element are tips of contact elements of the flexible probe card, wherein the contact elements provide the electrical contacts to said wafer under test.

17. The method of claim 14, wherein the one or more first portions are located at a periphery of the flexible probe card.

18. The method of claim 14, wherein the linear actuators comprise at least three linear actuators.

19. The method of claim 14, further comprising after actuating each linear actuator, providing electrical contacts between the flexible probe card and the wafer under test in the ATE, wherein the linear actuators are positioned relative to the rigid backing plate in a way enabling continuing of the providing of the backing.

20. A backing apparatus, comprising:

a probe card holder configured to rigidly affix one or more first portions of a flexible probe card to the probe card holder, wherein a respective back side of each of the one or more portions is adjacent to the probe card holder when the one or more first portions are rigidly affixed to the probe card holder;

linear actuators; and a rigid backing plate configured to rigidly affix a second portion of the flexible probe card to the rigid backing plate, wherein one side of the rigid backing plate is adjacent to a back side of the second portion when the second portion is rigidly affixed to the rigid backing plate, wherein each linear actuator is configured to provide backing of another side of the rigid backing plate against the probe card holder when electrical contacts between a wafer loaded for testing and the flexible probe card having the second portion rigidly affixed to the rigid backing plate and the one or more first portions rigidly affixed to the probe card holder are interrupted, wherein the linear actuators are positioned relative to the rigid backing plate in a way enabling continuing of the providing of the backing by the linear actuators when the flexible probe card having the second portion rigidly affixed to the rigid backing plate and the one or more first portions rigidly affixed to the probe card holder provides the electrical contacts to said wafer under test, wherein the one side and the other side of the rigid backing plate are opposite to each other.

* * * * *